United States Patent [19]

Takamatsu et al.

[11] Patent Number: 4,690,510
[45] Date of Patent: Sep. 1, 1987

[54] STRUCTURE AND METHOD OF CONNECTING TERMINALS OF MATRIX DISPLAY UNITS

[75] Inventors: Toshiaki Takamatsu, Tenri; Hiroshi Kuwagaki, Jyoyo; Shigehiro Minezaki, Ikoma; Kunihiko Yamamoto, Nara; Hiroshi Nakatani, Tenri; Hisao Kawaguchi, Sakai, all of Japan

[73] Assignee: Sharp Kabushiki Kaisha, Osaka, Japan

[21] Appl. No.: 803,522

[22] Filed: Dec. 2, 1985

Related U.S. Application Data

[63] Continuation of Ser. No. 512,633, Jul. 11, 1983, abandoned.

[30] Foreign Application Priority Data

Jul. 13, 1982 [JP] Japan .................. 57-122402
Jul. 28, 1982 [JP] Japan .................. 57-132810

[51] Int. Cl.⁴ ............................................. G02F 1/13
[52] U.S. Cl. .................................... 350/334; 350/336
[58] Field of Search ............ 339/17 F, 17 LM, 17 M, 339/DIG. 3, 58 M, 60 M; 29/338, 874; 338/154; 350/334, 336

[56] References Cited

U.S. PATENT DOCUMENTS

| 3,588,225 | 6/1971 | Nicastro | 350/336 X |
| 3,705,310 | 12/1972 | Wild | 350/336 |
| 4,042,861 | 8/1977 | Yasuda et al. | 350/334 |
| 4,132,984 | 1/1979 | Gross | 350/336 |
| 4,243,455 | 6/1981 | Shiba et al. | 350/336 X |
| 4,431,270 | 2/1984 | Funada et al. | 350/336 X |
| 4,474,432 | 10/1984 | Takamatsu | 350/336 X |

FOREIGN PATENT DOCUMENTS

| 0069186 | 5/1980 | Japan | 350/330 |
| 0022934 | 1/1981 | PCT Int'l Appl. | 350/336 |
| 2933812 | 3/1981 | PCT Int'l Appl. | 350/336 |

Primary Examiner—John K. Corbin
Assistant Examiner—David Lewis
Attorney, Agent, or Firm—Birch, Stewart, Kolasch & Birch

[57] ABSTRACT

There is disclosed a structure of a matrix display unit having a matrix display panel with mutually perpendicular groups of signal and scaning electrodes and a wiring board mounting thereon a driver circuit having output terminals disposed on two marginal edges of the wiring board. At least one of the marginal edges is bent closely toward the matrix display panel. Terminal electrodes of one of the groups of the matrix electrodes are electrically connected to the bent marginal edge in confronting relation through an electrically conductive anisotropic member, terminal electrodes of the other group of the matrix electrodes are electrically connected to the other marginal edge through a bent electrically conductive anisotropy member or a flexible wiring sheet.

6 Claims, 21 Drawing Figures

4,690,510

STRUCTURE AND METHOD OF CONNECTING TERMINALS OF MATRIX DISPLAY UNITS

This application is a continuation of application Ser. No. 512,633 filed on July 11, 1983 now abandoned.

BACKGROUND OF THE INVENTION

The present invention relates to the structure and methods of connecting terminals of a high-density information display unit having perpendicular layered electrodes or matrix electrode constructions.

In matrix display units such as liquid crystal displays, plasma displays or EL displays, the density of information display becomes higher and the quality of displayed information is better as the number of lines or scanning lines is larger. However, the more the scanning lines, the period of time required for applying signals per line, that is, a duty cycle, is reduced and the margin for crosstalk is also reduced. Where liquid crystals are employed as display elements, no sufficient contrast is available in such high-density liquid crystal displays for the reasons that the liquid crystals have no steep transmission-voltage characteristics and suffer from a slow response. Various solutions to such problems have been proposed. One proposed solution is to develop a liquid crystal material having applied voltage vs. light transmission characteristics with a sharp threshold. According to another proposal, a matrix addressing system is optimized to increase the drive margin ($\alpha = \text{Von/Voff}$). Still another solution is to increase an apparent resolving power through an improvement of the electrode construction. More specifically, as shown in FIG. 1(A) of the accompanying drawings, signal electrodes are divided into upper electrodes $Y_1, Y_2, \ldots, Y_n$ and lower electrodes $Y_1', Y_2', \ldots, Y_n'$, and the upper and lower signal electrodes are shared in common as opposed to scan electrodes. Alternatively, as shown in FIG. 1(B), adjacent signal electrodes $Y_j$, $Y_{j+1}$ are entered as comb teeth in a single scanning electrode $X_i$. According to a still further proposal, as shown in FIG. 2, there is provided one liquid crystal panel having scanning electrodes 2 and a signal electrode 3 disposed between glass plates 1, 4 and another liquid crystal panel composed of scanning electodes 2a and signal electrodes 3a positioned between a glass plate 1' and the glass plate 4, the liquid crystal panels being independently driven with the glass plate 4 being shared by the two liquid crystal panels.

According to the first and second solutions, it is not necessary to modify the construction of the liquid crystal panel, but no drastic increase in the number of drivable lines can be expected. The third proposal renders the liquid crystal panel complex in structure, but nevertheless can increase the number of drivable lines twice, or $2^2$ times. Though the third solution can thus increases the drivable lines, it also increase the number of terminals of signal electrodes twice, or $2^2$ times.

As illustrated in FIG. 3, an ordinary liquid crystal display panel has glass plates 4, 5, and signal electrodes 3 and scanning electrodes 2 which are formed on inner surfaces of the glass plates 4, 5. The signal electrodes 3 and the scanning electrodes 2 are not positioned on the same plane. A liquid crystal 6 is sealed between the glass plates 4, 5 by sealing resin 7. For incorporating the foregoing packaging processes, it is necessary to transfer the scanning electrodes 2 onto the signal glass plate 4 by a transfer material 8 such as an electrically conductive silver (Ag) paste to form a terminal of the scanning electrodes 2 flush with the signal electrodes 3. However, such electrode transfer has the following problems:

(I) The glass plates require regions for transferring the electrode, and cannot be rendered smaller in size;
(II) An additional step of transferring the electrode is needed, resulting in an increased cost; and
(III) The transfer material 8 tends to peel off at its interface with the glass plates 4, 5 due to different coefficients of thermal expansion of the sealing resin 7 and the transfer material 8, with the consequence that a conduction failure occurs and thus operation reliability is poor.

Where the third proposed solution is employed for connecting the liquid crystal panel to a wiring board without transferring the electrode, a marginal edge of the wiring board on which liquid crystal driver circuit elements are mounted is bent for electrical connection to terminals of the liquid crystal panel through the use of electrically conductive anisotropic rubber. With such a connecting process, as shown in FIG. 5, a glass plate 4 is employed to form a liquid crystal cell housing therein signal electrodes 3 and scanning electrodes 2, and a liquid crystal 6 is interposed between the electrodes 2, 3 and sealed at its periphery by a sealing material 7, thus constituting a liquid crystal panel. The terminals of the electrodes 2, 3 extend over an outer surface of the glass plate 4 and are connected electrically and mechanically to an end of a wiring board 11 with driver circuit elements 12 thereon through a gripper 10, there being a body 9 of electrically conductive anisotropic rubber (elastomer) interposed between the glass plate 4 and the wiring board 11. With this arrangement, the scanning electrodes 2 connected to the wiring board 11 are disposed below an end of the latter, and it is quite tedious and time-consuming to insert a body 13 of electrically conductive anisotropic rubber between the glass plate 4 and the end of the wiring board 11. It has been difficult to transfer an electrode to one of the glass plates with a transfer material in a matrix liquid crystal panel composed of a multiplicity of lines. Since terminal electrodes are mounted on confronting surfaces of the glass plates in such a liquid crystal panel, the liquid crystal panel cannot easily be mechanically secured to the wiring board on the side of the scanning electrode 2 through the above connecting process.

SUMMARY OF THE INVENTION

It is an object of the present invention to provide an improved structure for connecting terminals matrix display units which will eliminate the foregoing prior art difficulties.

Another object of the present invention is to provide a method of connecting terminals of matrix display units, which can use existing display panel constructions, and can assemble components easily through simple steps.

Still another object of the present invention is to interconnect electrodes spaced at small intervals or pitches on a display panel and electrodes spaced at small intervals or pitches on a wiring board easily with high accuracy.

According to the present invention, there is provided a structure for connecting terminals of a matrix display unit having a matrix display panel with mutually perpendicular groups of signal and scanning electrodes and a wiring board mounting thereon a driver circuit for driving the matrix display panel, the driver circuit having output terminals disposed on two marginal edges of the wiring board, the structure being formed with the steps of bending at least one of the marginal edges closely toward the display panel, electrically connecting terminal electrodes of one of the groups of electrodes to the bent marginal edge in confronting relation through an electrically conductive anisotropic member, and electrically connecting terminal electrodes of the other group of electrodes to the other marginal edge through a bent electrically conductive anisotropic member or a flexible wiring sheet.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
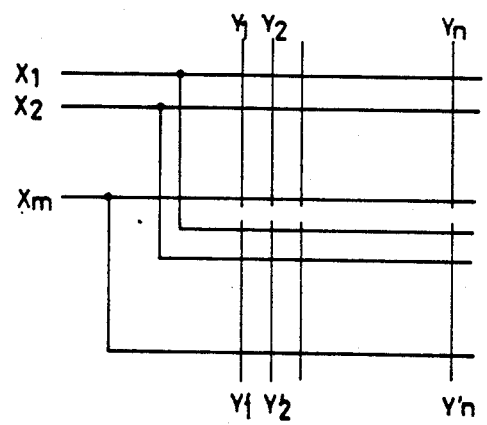
FIG. 1(A) is a schematic diagram showing divided upper and lower electrodes in a conventional liquid crystal panel.
FIG. 1(B) is a schematic diagram showing overlapped electrodes in a conventional liquid crystal panel.
Figure 1B:
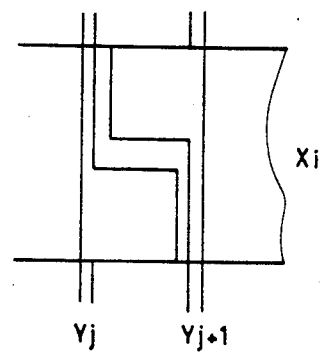
Figure 2:
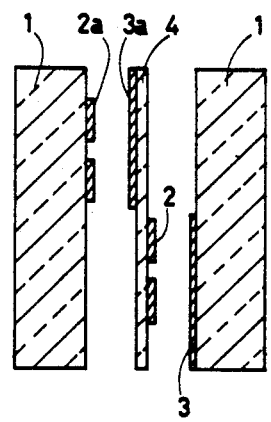
FIG. 2 is a cross-sectional view of two liquid crystal panels stacked together.
Figure 3:
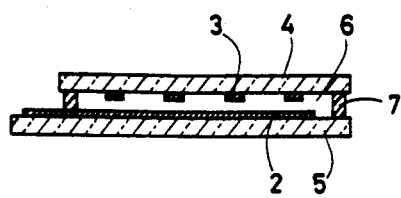
FIG. 3 is a cross-sectional view of an ordinary liquid crystal panel.
Figure 4:
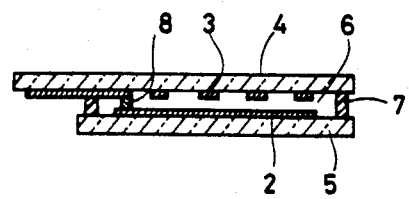
FIG. 4 is a cross-sectional view of a liquid crystal panel in which an electrode is transferred to one of glass plates.
Figure 5:
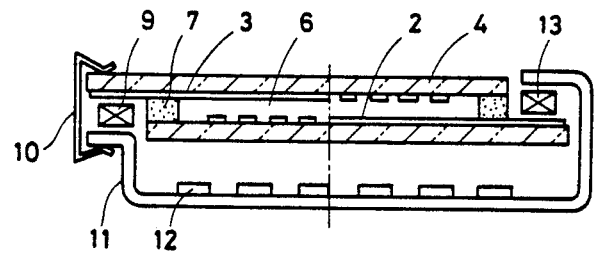
FIGS. 5 and 6 are cross-sectional views showing a conventional terminal connecting process.

FIGS. 6 through 9 show constructions of connecting terminals of signal electrodes and scanning electrodes between liquid crystal panels and wiring boards according to embodiments of the present invention. Like or corresponding parts in FIGS. 6 through 9 are denoted by like or corresponding reference characters in FIG. 5.

Throughout FIG. 5 through 9, FIGS. 12, 13, 17, 18 and 20, the lefthand side is a cross-sectional view taken parallel to signal electrodes, and the righthand side is a cross-sectional view taken parallel to scanning electrodes.

Either the scanning electrodes or the signal electrodes are connected electrically between a liquid crystal panel and a wiring board by a body of electrically conductive anisotropic rubber as with the prior art. The terminals of the other electrodes are electrically connected by a flexible wiring sheet. In each of the embodiments which follow, the scanning electrodes are connected by flexible wiring sheets.

Figure 6:
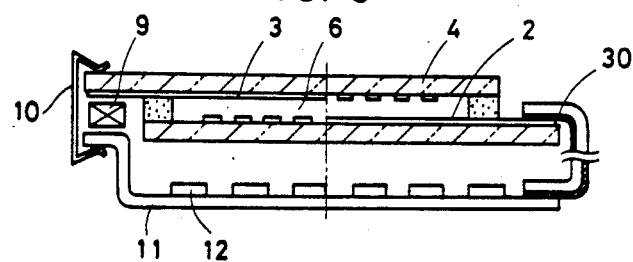

According to an embodiment shown in FIG. 6, terminal electrodes of signal electrodes and scanning electrodes from the liquid crystal panel are exposed on a glass plate, while the terminal electrodes of the driver circuit elements of the wiring board are exposed on the board, and thus a flexible wiring sheet 30 with two-sided through holes is used for connection.

Figure 7:
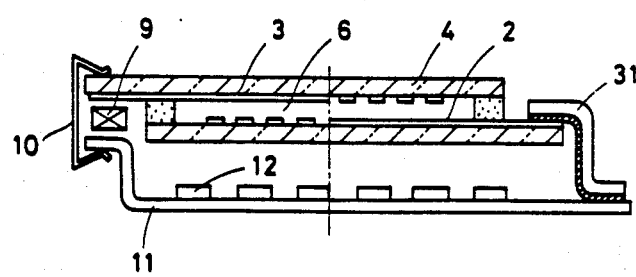
FIGS. 7 through 9 are cross-sectional views illustrating terminal connections according to embodiments of the present invention.
Figure 8:
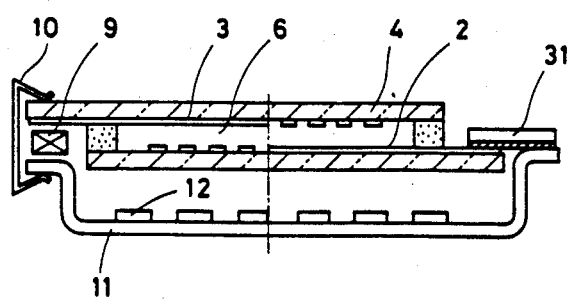
Figure 9:
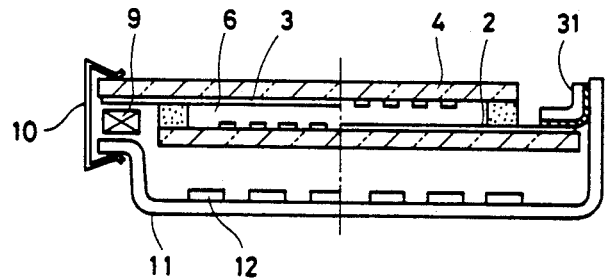

This embodiment is disadvantageous in that the flexible wiring sheet 30 with two-sided through holes is expensive and increases the cost. Where the terminals of the scanning electrodes are spaced at extremely small intervals or pitches, through holes coping with such pitches cannot be formed in the flexible wiring sheet 30. FIG. 7 shows an improved connecting method in which a liquid crystal panel and a wiring board are interconnected by a relatively inexpensive flexible wiring sheet 31 having electrodes formed on one side only. According to an embodiment illustrated in FIG. 8, a marginal edge of a wiring board on which terminals of driver circuit electrodes connected to terminals of scanning electrodes are mounted is bent near a liquid crystal panel as with an opposite marginal edge, and the bent marginal edge is further bent outwardly in a plane flush with the scanning electrodes on the liquid crystal panel. The bent marginal edge is connected to the liquid crystal panel by a flexible wiring sheet 31. An embodiment of FIG. 9 is directed to a process of connecting a marginal edge of a wiring board bent closely toward a liquid crystal panel with a flexible wiring sheet 31. The flexible wiring sheets 30, 31 are composed of an electrically conductive material such as thermoplastic resin for example phenolic resin impregnated with carbon or silver, the electrically conductive material being printed on a film of polyester by screen printing. The wiring sheet thus formed will hereinafter referred to as a "thermally pressable wiring sheet". The wiring sheet, being composed of thermoplastic resin, can easily be bonded to a glass plate or wiring board simply by simultaneously heating and pressing a portion of the sheet to be bonded at a temperature of about 180° C. Another material for the flexible wiring sheet comprises a highly thermally resistant film of polyimide with copper foil deposited thereon by photoetching. This wiring sheet will hereinafter referred to as a "polyimide wiring sheet". The polyimide wiring sheet can be soldered to the glass plate and the wiring board.

Figure 10:
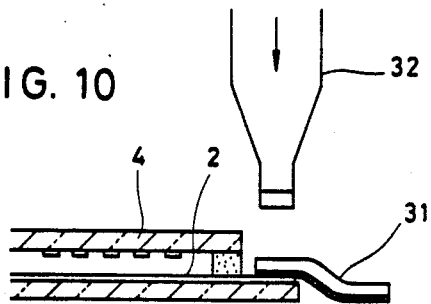
FIG. 10 is a view showing the manner in which a wiring sheet is joined with heat under pressure.
Figure 11:
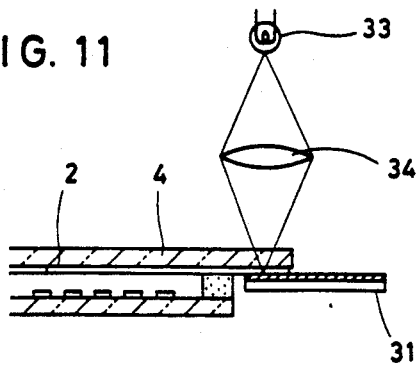
FIG. 11 is a view showing the manner in which a wiring sheet of polyimide is joined.

Methods of connecting the above two flexible wiring sheets to the glass plate and the wiring board will be described in more detail. With the thermally pressable wiring sheet, a heated head 32 is depressed under the force of compressed air to heat and press a portion of the thermally pressable sheet which is to be bonded, as shown in FIG. 10. The thermally pressable sheet is first connected to the liquid crystal panel and then to the wiring board. In the embodiment shown in FIG. 8, the portions to be interconnected lie flush with each other, and they can simultaneously be joined by providing a spacer of suitable thickness between the liquid crystal panel and the wiring board. With the polyimide wiring sheet, solder is melted by a ray of infrared radiation emitted from a light source 33 and converged by a lens 34, as shown in FIG. 11. The polyimide wiring sheet is first connected to the liquid crystal panel and then to the wiring board.

Other embodiments directed to improvements according to the present invention will now be described.

Figure 12:
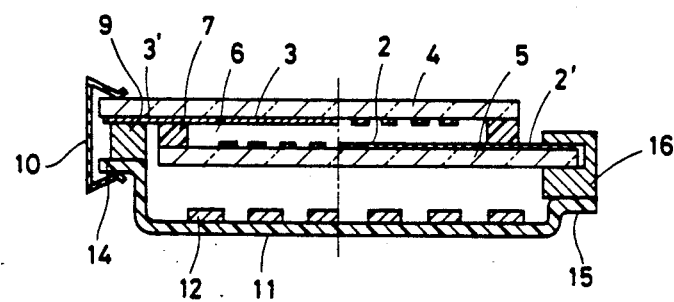
FIGS. 12 and 13 are cross-sectional views showing other embodiments, respectively, of the present invention.

As shown in FIG. 12, a liquid crystal panel is composed of signal electrodes 3 with terminal electrodes 3' thereof deposited on an inner surface of a signal glass plate 4, and scanning electrodes 2 with their terminal electrodes 2' deposited on an inner surface of a scanning glass plate 5. A wiring board 11 supports thereon a liquid crystal panel driver circuit 12 having output lines extending over marginal edges 14, 15 of the wiring board 11 with many terminals fixed thereto, the marginal edges 14, 15 being bent in one direction. The wiring board 11 is positioned behind the liquid crystal panel. A body 9 of an electrically conductive anisotropic rubber having electrical conductivity in one direction (vertical direction as shown) is interposed between the terminal electrodes 3' of the signal electrodes 3 and the confronting terminals on the marginal edge 14 of the wiring board 11, thus electrically interconnecting the terminal electrodes 3' and the corresponding terminals on the marginal edge 14. A C-shaped body 16 of electrically conductive anisotropic rubber having electrical conductivity in one direction is interposed between the terminal electrodes 2' of the scanning electrodes 2 and the terminals on the other marginal edge 15 of the wiring board 11 which face in the same direction as that of the terminal electrodes 2', thus electrically interconnecting the terminal electrodes 2' and the corresponding terminals on the marginal edge 15. Thereafter, the liquid crystal panel is fixed to the wiring board 11 by a gripper 10.

With the above embodiment, both the marginal edge 14 connected to the terminal electrodes 3', and the marginal edge 15 connected to the terminal electrodes 2' are bent toward the liquid crystal panel. This can reduce not only the resistance of the body 9 of electrically conductive anisotropic rubber, but also the resistance of the bent body 16 of electrically conductive anisotropic rubber, and can accurately interconnect not only the terminal electrodes 3' and the marginal edge 14, but also the terminal electrodes 2' and the marginal edge 15.

Figure 13:
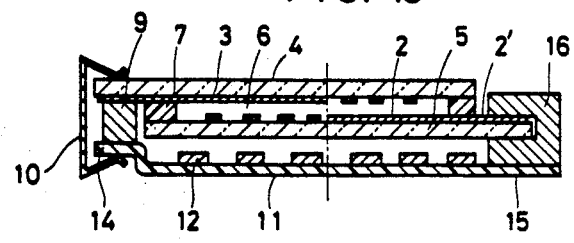

The thinner the driver circuit components 12 on the wiring board 11, the smaller the distance between the wiring board 11 and the glass substrate 5 of the liquid crystal panel. With such distance greatly reduced, the marginal edge 15 of the wiring board 11 may not necessarily be bent toward the liquid crystal panel. As illustrated in FIG. 13, the marginal edge 15 which is straight can be connected to the terminal electrodes 2' of the liquid crystal panel without increasing the resistance of the body 16 of electrically conductive anisotropic rubber.

Figure 14:
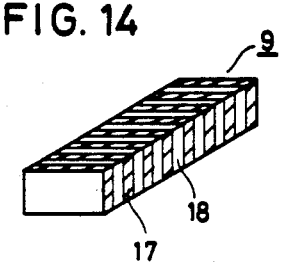
FIG. 14 is a perspective view of a body of electrically conductive anisotropic rubber.

As shown in FIG. 14, the body 9 of electrically conductive anisotropic rubber may comprise alternatively electrically conductive layers 17 and insulating layers 18 with the layers 17 being spaced at intervals or pitches which are ½ of or smaller than ½ of the intervals or pitches of the terminal electrodes 3' and the terminals on the marginal edge 14.

Figure 15:
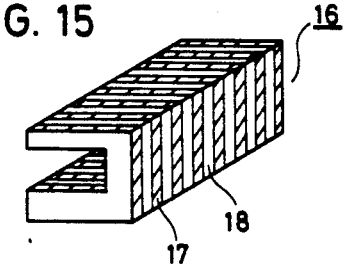
FIG. 15 is a perspective view of a bent body of electrically conductive anisotropic rubber.

As shown in FIG. 15, the body 16 of electrically conductive anisotropic rubber may comprise alternatively electrically conductive layers 17 and insulating layers 18, which are bent over or molded. The layers 17 are also spaced at intervals or pitches which are ½ of or smaller than ½ of the intervals or pitches of the terminal electrodes 2' and the terminals on the marginal edge 15.

Figure 16:
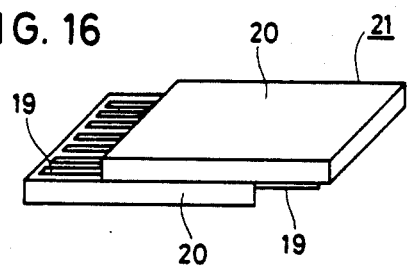
FIG. 16 is a perspective view of another body of electrically conductive anisotropic rubber prior to being bent over.
Figure 17:
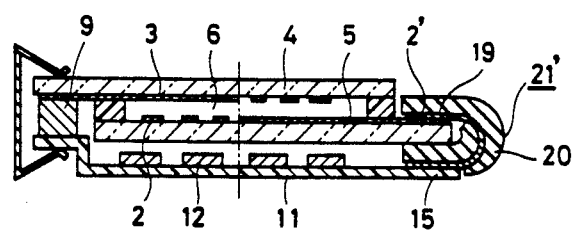
FIGS. 17 and 18 are cross-sectional views showing constructions utilizing the body of electrically conductive anisotropic rubber shown in FIG. 16.
Figure 18:
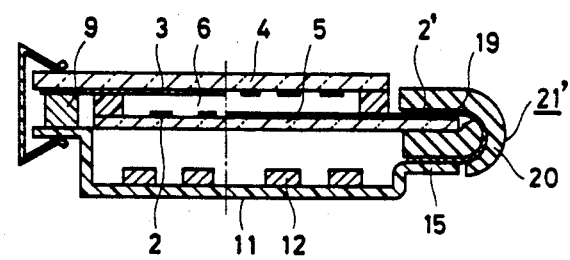

FIG. 16 illustrates another form of electrically conductive anisotropic rubber which can be bent over. The illustrated body 21 comprises two sheets of insulating rubber with thin wires 19 of metal being sandwiched therebetween. In use, as shown in FIG. 17 and 18, the body 21 of electrically conductive anisotropic rubber is bent over into a configuration 21' to bring ends of the thin metal wires 19 into contact with the terminal electrodes 2' and the other ends of the thin metal wires 19 into contact with the terminals on the marginal edge 15. Since the bent body 21' of electrically conductive anisotropic rubber employs the metal wires 19 as conductive members, it can interconnect the wiring board and the liquid crystal panel without involving an increase in the electrical resistance in both of the arrangements of FIGS. 11 and 12, that is, irrespective of whether the marginal edge 15 is bent over or remains straight. Therefore, the bent body 21' of electrically conductive anisotropic rubber can be used almost without being affected by the thickness of the driver circuit elements 12.

Figure 19:
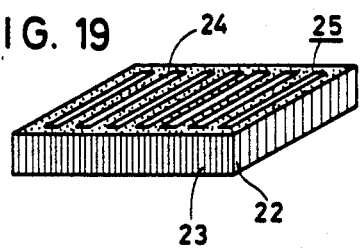
FIG. 19 is a perspective view of still another body of electrically conductive anisotropic rubber prior to being bent over.
Figure 20:
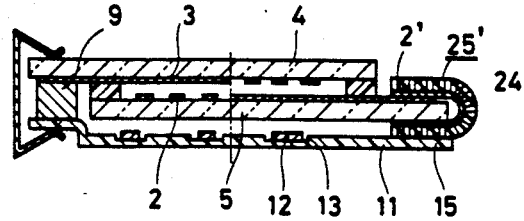
FIG. 20 is a cross-sectional view of a construction incorporating the body of electrically conductive anisotropic rubber illustrated in FIG. 19.

FIG. 19 shows still another body 25 of electrically conductive anisotropic rubber which comprises a sheet 22 of insulating rubber with a multiplicity of electrically conductive thin wires 23 embedded transversely therein. A circuit pattern 24 is printed on one surface of the sheet 22 with electrically conductive ink or electrically conductive paste. In use, the body 25 is bent into a form 25' which connects the terminal electrodes 2' and the marginal edge 15. With this arrangement, the body 25 may be thinner than the body 21 shown in FIG. 16. For example, the thickness of the body 25 may be about 0.2 mm. By placing the driver circuit components 12 in recesses 26 in the wiring board, together with the reduced thickness of the body 25, there can be produced a display unit having a smaller thickness than that of the preceding embodiments.

While in the foregoing embodiments the scanning glass plate 5 is placed in a lower portion of the liquid crystal panel, the scanning glass plate 5 and the signal glass plate 4 may be positioned upside down. Since the pitches of the scanning electrodes are greater than the pitches of the signal electrodes, the upper signal glass plate 4 allows positional alignment between the scanning terminal electrodes 2' and the terminals on the marginal edge 15 to be performed automatically by positional alignment between the signal terminal electrodes 3' and the terminals on the marginal edge 14.

Therefore, the illustrated embodiments are more preferred for such positional alignment.

The foregoing embodiments have been shown and described as being incorporated in liquid crystal displays. However, the present invention is directed to a method of connecting terminals, and equally applicable to general flat-type matrix displays such as plasma displays, EL displays and the like. Consequently, applications other than liquid crystal displays are covered by the present invention.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A matrix display unit having a matrix display panel with mutually perpendicular groups of signal and scanning electrodes comprising:
    wiring board means, operatively interconnected to at least two opposing ends of said matrix display panel, for mounting thereon driver means having first and second output terminals disposed respectively on first and second edges of said wiring board means, said first and second edges being orthogonal to each other, at least one of said first and second edges being bent toward said matrix display panel;
    first conductive means, having electrically conductive anisotropy, for connecting said first output terminals of said driver means to first terminal electrodes of one of said mutually perpendicular groups of electrodes, said first terminal electrodes being in juxtaposition with and facing said first output terminals on said first edge of said wiring board means; and
    second conductive means of flexible wiring including a sheet with only one conductive side for connecting second terminal electrodes of the other of said mutually perpendicular groups of said electrodes to said second means without folding over itself, terminal electrodes being aligned with said second output terminals on said second edge of said wiring board means such that said second conductive means connects said second terminal electrodes to said second output terminals without the necessity for a through-hole.

2. A matrix display unit having a matrix display panel with mutually perpendicular groups of signal and scanning electrodes of claim 1, wherein said flexible wiring shown electrically conductive anisotropy.

3. A matrix display unit with mutually perpendicular groups of signal and scanning electrodes according to claim 1, wherein said driver means are mounted into recesses on said wiring board means.

4. A matrix display unit comprising:
    first and second support means in a mutually opposing planar relationship for forming a liquid crystal display panel;
    first electrode means disposed on either of said first or second support means;
    driver means for driving said liquid crystal display panel;
    driver support means for supporting said driver means;
    second electrode means mounted on said driver support means, said second electrode means being in a mutually perpendicular relationship to said first electrode means; and
    connector means for connecting said first and second electrode means, said connector means bridging together either end of said first and second support means without the necessity for a through-hole;
    said first and second electrode means being aligned such that said connector means bridges together either end of said first and second support means without having to be folded over itself.

5. A matrix display unit of claim 4, wherein said connector means is electrically conductive anisotropy.

6. A matrix display unit according to claim 4, wherein said second electrode means are recessed into said driver support means.

* * * * *